(12) United States Patent
Schug

(10) Patent No.: US 8,398,448 B2
(45) Date of Patent: Mar. 19, 2013

(54) ASSEMBLING LIGHTING ELEMENTS ONTO A SUBSTRATE

(75) Inventor: Josef Andreas Schug, Wuerselen (DE)

(73) Assignee: Koninklijke Electronics N.V., Eindhoven (NL)

( * ) Notice: Subject to any disclaimer, the term of this patent is extended or adjusted under 35 U.S.C. 154(b) by 597 days.

(21) Appl. No.: 12/092,753

(22) PCT Filed: Nov. 3, 2006

(86) PCT No.: PCT/IB2006/054083
§ 371 (c)(1), (2), (4) Date: May 6, 2008

(87) PCT Pub. No.: WO2007/054868
PCT Pub. Date: May 18, 2007

(65) Prior Publication Data
US 2008/0284311 A1 Nov. 20, 2008

(30) Foreign Application Priority Data
Nov. 9, 2005 (EP) ..................... 05110504

(51) Int. Cl.
*H01J 9/24* (2006.01)
(52) U.S. Cl. ....................................... 445/23
(58) Field of Classification Search ............. 445/22–24
See application file for complete search history.

(56) References Cited

U.S. PATENT DOCUMENTS

| 5,043,296 | A | 8/1991 | Hacke et al. |
| 6,045,240 | A * | 4/2000 | Hochstein ..................... 362/294 |
| 6,641,284 | B2 | 11/2003 | Stopa et al. |
| 2003/0057426 | A1 | 3/2003 | Miyazaki et al. |
| 2004/0140543 | A1 | 7/2004 | Elpedes et al. |
| 2006/0091784 | A1 | 5/2006 | Conner et al. |

FOREIGN PATENT DOCUMENTS

| EP | 1566847 A1 | 8/2005 |
| JP | 63133684 A | 6/1988 |
| JP | 04201272 A | 7/1992 |
| JP | 2005223183 A | 8/2005 |
| WO | WO 2005075883 A1 * | 8/2005 |

* cited by examiner

*Primary Examiner* — Anh Mai
*Assistant Examiner* — Hana Featherly
(74) *Attorney, Agent, or Firm* — Mark Beloborodov; David Zivan

(57) ABSTRACT

The present application relates to assembling a lighting element (20) onto a substrate (28). To enable exact positioning of the lighting element (20) and further optical components (30), there is provided aligning the lighting element (20) with a support element (22) within one mounting plane P using an auxiliary carrier (24), surface mounting the lighting element (20) together with the support element (22) onto a substrate (28) within one step e.g. by reflow soldering, and mounting a further component (30) onto the support element (22) such that no mechanical stress is applied to the lighting element (20).

17 Claims, 3 Drawing Sheets

ASSEMBLING LIGHTING ELEMENTS ONTO A SUBSTRATE

Figure 1:
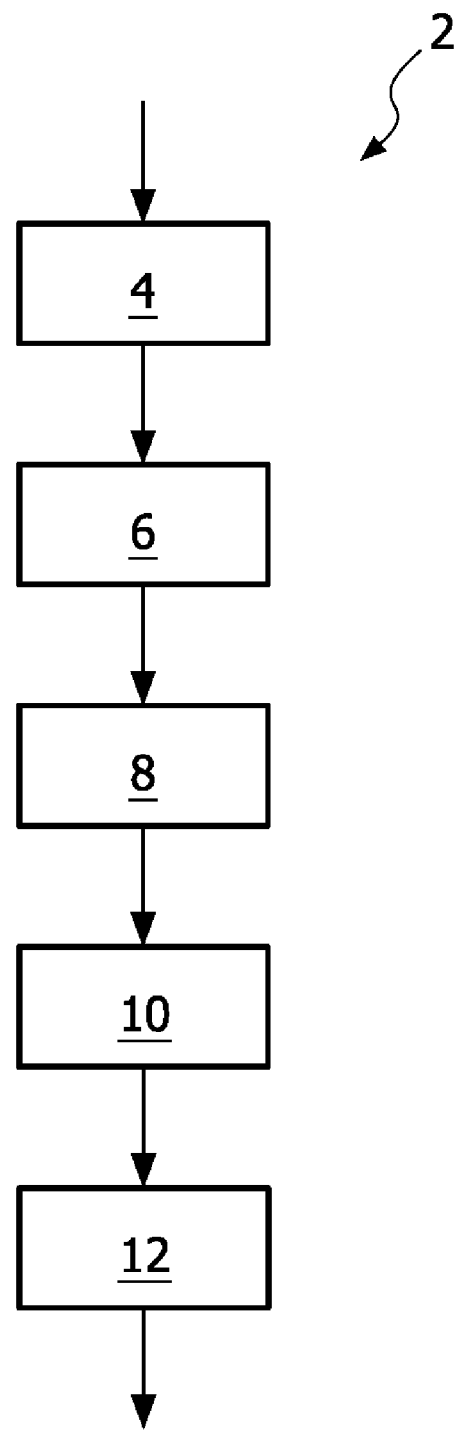

The present application relates in general to assembling a lighting element onto a substrate. Further, the application relates to the use of a lighting element, and lighting modules comprising a lighting element.

Surface-mounted lighting elements, such as light emitting diodes (LED) constitute the problem of accurate alignment when surface mounted on a substrate. In particular, during soldering or gluing optical components, such as collimators and micro-collimators, accurate alignment of these with the LEDs may be difficult.

First, the surface-mounted LEDs need to be connected to connection pads on the substrate. This is often-times done by a soldering or bonding process. For instance, a reflow soldering process is provided to bond the LEDs onto the substrate.

During this reflow soldering process, a conducting paste is applied to bonding pads on the circuit board. The electrical components are attached onto the bonding pads by adhesion of the paste. Then, the circuit board with the attached components is subjected to a heating process. During this process, the conducting paste becomes solid and the components become soldered to the circuit board. However, during the soldering of the components onto the substrate, the components tend to "swim" away, as the paste is heated and the adhesion does not suffice to hold the components in place until the paste is solid. This may lead to miss-alignment of the components. That means that the LEDs cannot be placed on an exact position.

In addition, when mounting further optical components onto the substrate, these optical components need to be aligned accurately with the already mounted LEDs. The alignment needs to be such that the distance between the optical components and the LEDs is exact. For instance, when mounting collimators, the distance between the collimators and the LES needs to be at a minimum, however, without mechanical contact between the LEDs and the collimators.

Therefore, it is one object of the application to provide accurate alignment of optical components. It is a further object of the application to provide easy alignment of optical components. Yet, it is another object of the application to provide a method for assembling optical components without destroying the lighting elements during assembly.

In order to overcome the problems outlined above, there is provided, according to one aspect of the application, a method for assembling a lighting element onto a substrate with aligning the lighting element with a support element within one mounting plane, and surface mounting the lighting element together with the support element onto a substrate within one step.

The lighting elements and the support elements can be aligned within one single mounting plane. A mounting plane can be parallel to the plane of the substrate. By having arranged the lighting element and the support element within one plane, it is possible to mount the lighting element and the support element onto the substrate within one single step. There is no need to mount the lighting element onto the substrate first, and then to mount the support element onto the substrate in a further step. By providing one single mounting step, it is possible to provide accurate alignment of the lighting elements and the support elements.

The support element can be any solid material capable of being mounted onto the substrate.

In order to assemble a lighting unit, a further component can be mounted onto the support element such that no mechanical stress is applied to the lighting element. As there is an accurate alignment between the support element and the lighting element, the further component can be mounted onto the support element without mechanical stress onto the lighting element. Contact between the lighting element, and the further component can be prevented.

It is preferred that the lighting element is a light emitter, such as a light emitting diode (LED), a surface mounted LED, or an optical sensor, such as a charge coupled device (CCD).

In order to align the lighting element and the support element within the mounting plane, embodiments provide mounting the lighting element and the support element into a carrier matrix. The carrier matrix can define the distances between the lighting elements and the support elements. By mounting the elements into the carrier matrix, the distance between lighting elements and support elements soldered onto the substrate can be clearly defined. The carrier matrix can be designed such that the distance between the elements is such, that further components can be mounted onto the support elements such that no mechanical stress is applied onto the lighting element.

Securing the lighting element and/or the support element within seatings of the carrier matrix is provided according to embodiments. Seatings can be recesses within the surface of the matrix, which may have exactly the shape of the elements that need to be secured within the carrier matrix. It is also possible, to secure the elements within the seatings by air suction. Also, the setting can be flexible, such that the elements are secured by a tight fit.

According to embodiments, the lighting element and the support element are mounted onto the substrate by bonding. This surface mounting technology can be solder bonding, or any other bonding method.

After having mounted the lighting element and the support element onto the substrate, for instance, by surface mounted bonding, the further component can be secured mechanically to the support element according to embodiments. This can be done, for example, by gluing the further component onto the support element.

Embodiments provide mounting an optical component onto the support element. This optical component can be any component used to collect, distribute and/or redirect the light output from the lighting element, or to collect, distribute and/or redirect light onto the lighting element. The optical component can be a collimator, as well as a micro-collimator, according to embodiments.

A micro-collimator can have a limited distance to the lighting element, e.g. 0,5 mm. The distance can as well be lower than this. The distance between an outer edge of the micro-collimator and the outer edge of the lighting element may be even as low as 0,25 mm.

In order to cool down the lighting element, embodiments also provide mounting a heat sink onto the support element. The heat sink may as well comprise an optically active surface.

In order to provide a lighting unit with more than one lighting element, embodiments provide at least one support element between at least two lighting elements. Thus, further components can be secured to the support element, and used by at least two lighting elements.

Embodiments provide at least two support elements with at least two lighting elements, such that a fixed distance between the support elements and the lighting elements is provided. This fixed distance can be selected such that the further components can be mounted onto the support elements at a minimum distance to the lighting element, however, without mechanically contacting the lighting elements. By that, a highly condensed assembly of lighting elements and optical components is possible.

Another aspect of the application is a use of a described method for assembling optical components with lighting elements.

A further aspect of the application is a lighting module comprising at least one lighting element, and at least one support element, and wherein the lighting element and the support element are mounted within one step onto a substrate.

It is possible that a further optical component is mounted onto the support element. The lighting module is assembled preferably according to a method described above. The lighting module can be used preferably within automotive lighting units, such as, for instance, automotive head lamp modules.

Figure 2:
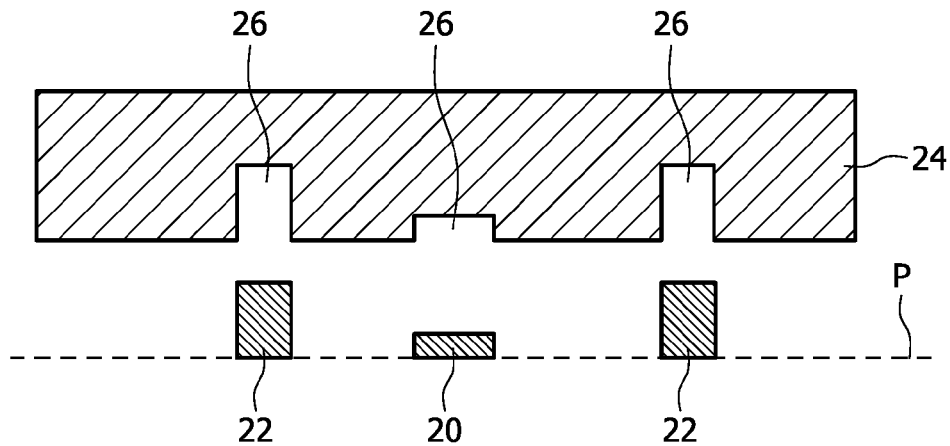
Figure 3:
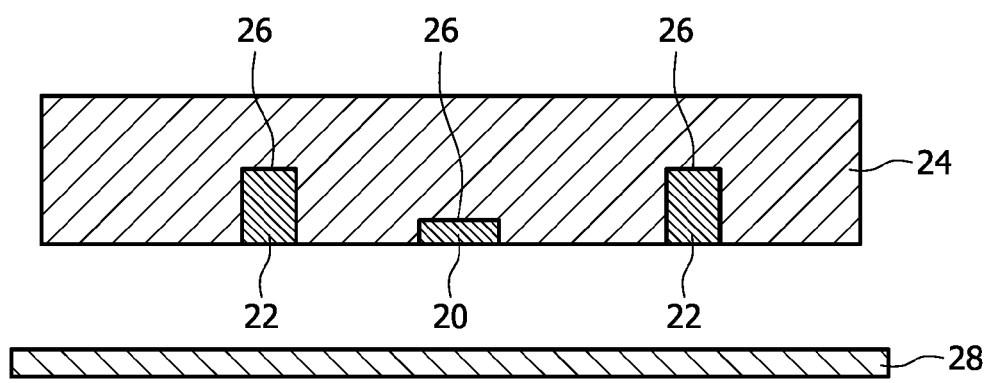
Figure 4:
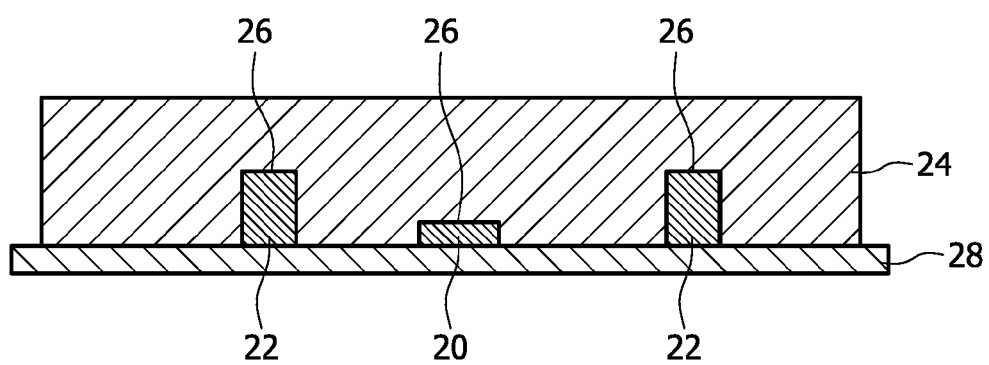
Figure 5:
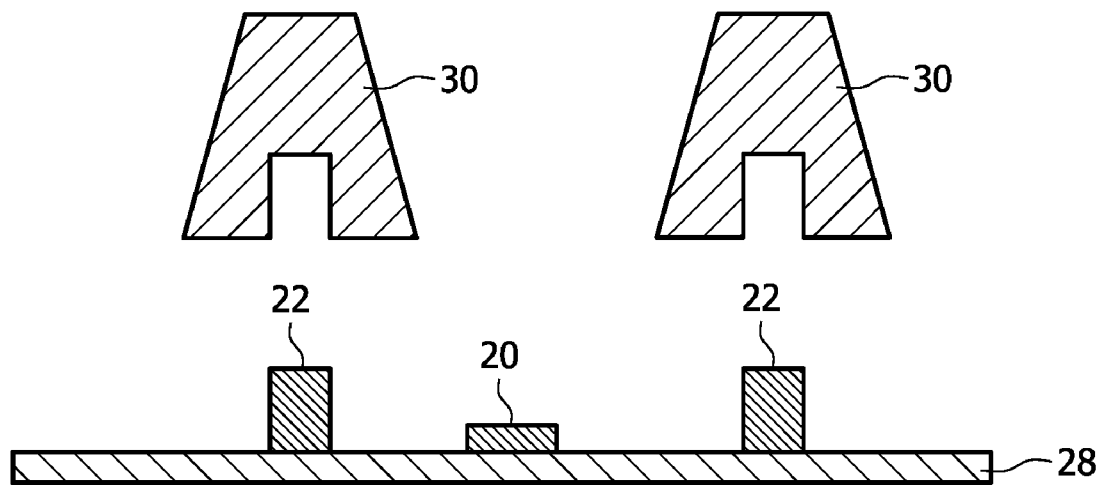
Figure 6:
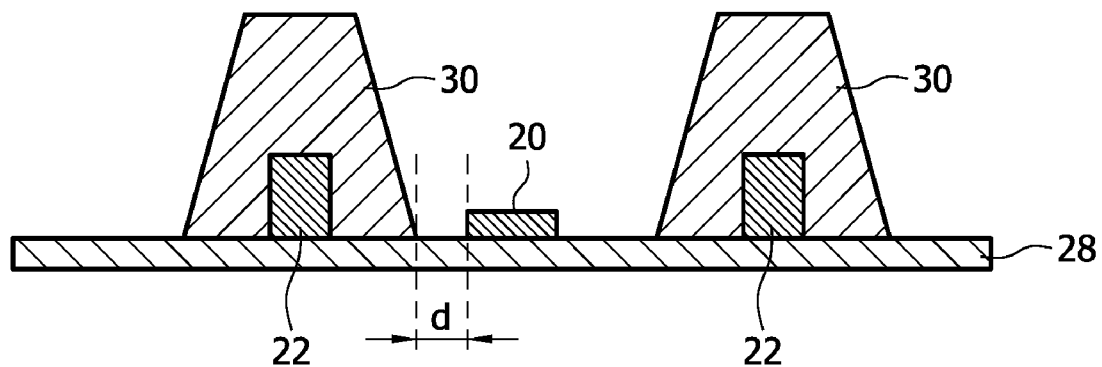

These and other aspects of the application will be described in more detail exemplarily within the following Figures. In the Figures show:

FIG. 1 a flowchart of an inventive method;

FIG. 2 a carrier matrix, an LED, and support elements;

FIG. 3 an LED and support elements aligned within the carrier matrix in the mounting plane;

FIG. 4 Surface-mounting of the LED and the support elements onto a substrate;

FIG. 5 The mounted LED and support elements together with two collimators;

FIG. 6 Collimators mechanically fixed to the support elements.

FIG. 1 illustrates a method 2 for assembling a lighting element onto a substrate. In a first step 4, the LED is aligned with support elements. This is illustrated in FIG. 2.

FIG. 2 depicts an LED 20 and support elements 22. Further, illustrated is a carrier matrix 24. As illustrated, LED 20 and support element 22 are aligned with their basis within one plane P. Carrier matrix 24 is positioned such that recesses 26 are aligned with LED 20 and support element 22.

After having aligned the LED 20 and support element 22 in one mounting plane P, the LED 20 and the support element 22 are mounted in a step 6 into the carrier matrix 24, as illustrated in FIG. 3.

As can be seen in FIG. 3, the LED 20 and the support element 22 are mounted within the recesses 26 of carrier matrix 24. Further illustrated is a substrate 28. The carrier matrix 24 carries LED 20 and support element 22 at fixed distances. The recesses 26 are formed, such that LED 20 and support element 22 are mechanically fixed within the carrier matrix 24.

After having aligned the elements 20, 22 in one mounting plane P and after having mounted the LED 20 and the support element 22 within carrier matrix 24, the assembly is bonded in a step 8 onto the substrate 28.

As illustrated in FIG. 4, the carrier matrix 24 mounts within one single step 8 LED 20 and support element 22 onto substrate 28. The elements 20, 22 are soldered onto the substrate 28. Substrate 28 comprises bonding pads (not illustrated), onto which the elements 20, 22 are soldered. The soldering can be done using a reflow soldering process. The LED 20 can be electrically connected through the bonding pads.

After having soldered the elements 20, 22 onto substrate 28 in step 8, the matrix 24 is lifted to remove elements 20, 22 from the recesses 26.

Then, optical components, such as collimators, lenses, reflective elements or other optical components, are positioned in step 10 above the support elements 22, as will be illustrated in FIG. 5. FIG. 5 shows the elements 20, 22 soldered onto substrate 28, and in addition collimators 30 as an example for optical components. The collimators 30 are formed, such that they comprise recesses, which exactly fit onto the support elements 22.

The collimators 30 are fixed in step 12 to the support elements 22, as illustrated in FIG. 6. FIG. 6 shows that the collimators 30 are mechanically fixed to the support elements. This can be done by gluing the collimators 30 to the support elements 22. The distance d between the support elements 22 and the LED 20 is chosen, such that it becomes minimal. By having aligned the support element 22 with the LED 20 using the carrier matrix 24, the distance d can be clearly defined. The collimators can be mounted onto the support elements 22 without mechanical force or stress to the LED 20.

As a result, a lighting module comprising LED 20, support element 22, substrate 28, and collimator 30 is assembled. Instead of gluing collimator 30 to the support elements 22, it is also possible to fix a heat sink (not shown) onto support elements 22.

The inventive method provides assembling an LED with further optical components without applying mechanical force or stress onto the LED. The assembly is characterised by exact fitting between LED and optical components, as the position of LED and optical components can be clearly defined, and the manufacturing process supports the exact positioning of the elements 20, 22.

The invention claimed is:

1. A method for assembling a lighting element and a support element for a component onto a substrate, comprising
   aligning the lighting element with the support element within one mounting plane (P) at a fixed distance from the substrate, wherein the mounting plane (P) is substantially parallel to the substrate, and
   surface mounting the lighting element together with the support element onto the substrate in one step.

2. The method of claim 1, further comprising mounting the component onto the support element such that no mechanical stress is applied to the lighting element.

3. The method of claim 1, wherein the lighting element is a light emitter or an optical sensor.

4. The method of claim 1, wherein the lighting element is a surface mounted light emitting diode.

5. Method of claim 1, wherein aligning the lighting element with the support element within one mounting plane (P) comprises mounting the lighting element and the support element into one carrier matrix and keeping the lighting element and the support element in the carrier matrix until they are fixed to the substrate.

6. The method of claim 5, wherein the carrier matrix defines a plurality of seatings and wherein mounting the lighting element and the support element into the carrier matrix comprises mechanically securing the lighting element and the support element at least partially in the seatings.

7. The method of claim 5, wherein mounting the lighting element and the support element into the carrier matrix comprises securing the support element at fixed distances to the lighting elements within the carrier matrix.

8. The method of claim 1, wherein surface mounting the lighting element together with the support element onto the substrate comprises bonding at least the lighting element onto the substrate.

9. The method of claim 8, wherein surface mounting the lighting element together with the support element onto the substrate comprises soldering at least the lighting element onto the substrate using a reflow soldering process.

10. The method of claim 8, wherein surface mounting the lighting element together with the support element onto the substrate comprises solder bonding at least the lighting element onto the substrate.

11. The method of claim 1, wherein mounting the component onto the support element comprises mechanically securing or gluing the component onto the support element.

12. The method of claim 1, wherein the component is an optical component comprising a collimator.

13. The method of claim 12, wherein the collimator is a micro-collimator.

14. The method of claim 1, wherein the component comprises a heat sink.

15. The method of claim 1, further comprising providing at least one support element between at least two lighting elements.

16. The method of claim 1, further comprising aligning at least two support elements with at least one lighting element such that a fixed distance between the support elements and the lighting elements is provided.

17. The method of claim 16, wherein the fixed distance between the support elements and the lighting elements is selected such that when mounting the component onto the support element, the component does not contact the lighting element.

* * * * *